(12) United States Patent
Paskover et al.

(10) Patent No.: US 11,378,394 B1
(45) Date of Patent: Jul. 5, 2022

(54) ON-THE-FLY SCATTEROMETRY OVERLAY METROLOGY TARGET

(71) Applicant: KLA Corporation, Milpitas, CA (US)

(72) Inventors: Yuri Paskover, Milpitas, CA (US); Itay Gdor, Tel-Aviv (IL); Yuval Lubashevksy, Milpitas, CA (US); Vladimir Levinski, Nazareth Ilit (IL); Alexander Volfman, Milpitas, CA (US); Yoram Uziel, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/119,536

(22) Filed: Dec. 11, 2020

(51) Int. Cl.
  *G01B 11/27* (2006.01)
(52) U.S. Cl.
  CPC .................. *G01B 11/272* (2013.01)
(58) Field of Classification Search
  CPC ........................................ G01B 11/272
  USPC ......................................... 356/446
  See application file for complete search history.

(56) References Cited

U.S. PATENT DOCUMENTS

| | | | |
|---|---|---|---|
| 7,440,105 B2 * | 10/2008 | Adel | H01L 22/12 356/401 |
| 7,541,201 B2 | 6/2009 | Ghinovker | |
| 7,671,990 B1 * | 3/2010 | Adel | G03F 7/70633 356/400 |
| 8,330,281 B2 | 12/2012 | Ghinovker et al. | |
| 9,214,317 B2 | 12/2015 | Shur | |
| 9,476,698 B2 | 10/2016 | Abdulhalim et al. | |
| 9,885,961 B1 * | 2/2018 | Amir | G03F 7/70633 |
| 10,190,979 B2 | 1/2019 | Manassen et al. | |
| 10,527,951 B2 | 1/2020 | Yohanan et al. | |
| 2013/0035888 A1 | 2/2013 | Kandel et al. | |
| 2015/0177135 A1 | 6/2015 | Amit et al. | |
| 2015/0293458 A1 * | 10/2015 | Vanoppen | G03F 7/70558 355/53 |
| 2016/0093574 A1 | 3/2016 | Cai et al. | |
| 2016/0146740 A1 | 5/2016 | Lu et al. | |
| 2020/0241429 A1 | 7/2020 | Yang et al. | |

FOREIGN PATENT DOCUMENTS

| | | |
|---|---|---|
| KR | 101185992 B1 | 9/2012 |
| WO | 2018004511 A1 | 6/2016 |

OTHER PUBLICATIONS

Adel, Mike et al., "Diffraction order control in overlay metrology: a review of the roadmap options," Proc. SPIE. 6922, Metrology, Inspection, and Process Control for Microlithography XXII, 692202. (2008).
International Search Report and Written Report in International Application No. PCT/US2021/061296 dated Mar. 24, 2022, 9 pages.

* cited by examiner

*Primary Examiner* — Tarifur R Chowdhury
*Assistant Examiner* — Omar H Nixon
(74) *Attorney, Agent, or Firm* — Suiter Swantz pc llo

(57) ABSTRACT

A metrology target is disclosed, in accordance with one or more embodiments of the present disclosure. The metrology target includes a first set of pattern elements having a first pitch, where the first set of pattern elements includes segmented pattern elements. The metrology target includes a second set of pattern elements having a second pitch, where the second set of pattern elements includes segmented pattern elements. The metrology target includes a third set of pattern elements having a third pitch, where the third set of pattern elements includes segmented pattern elements.

24 Claims, 8 Drawing Sheets

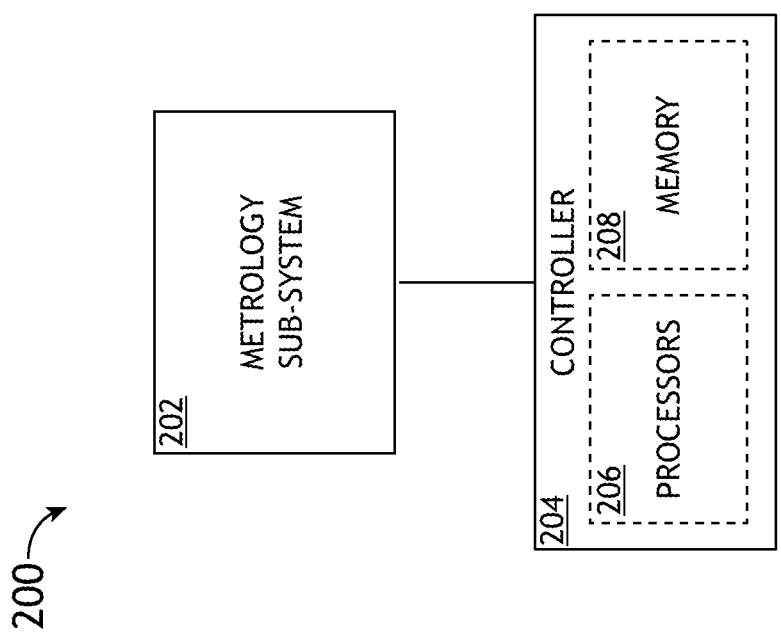

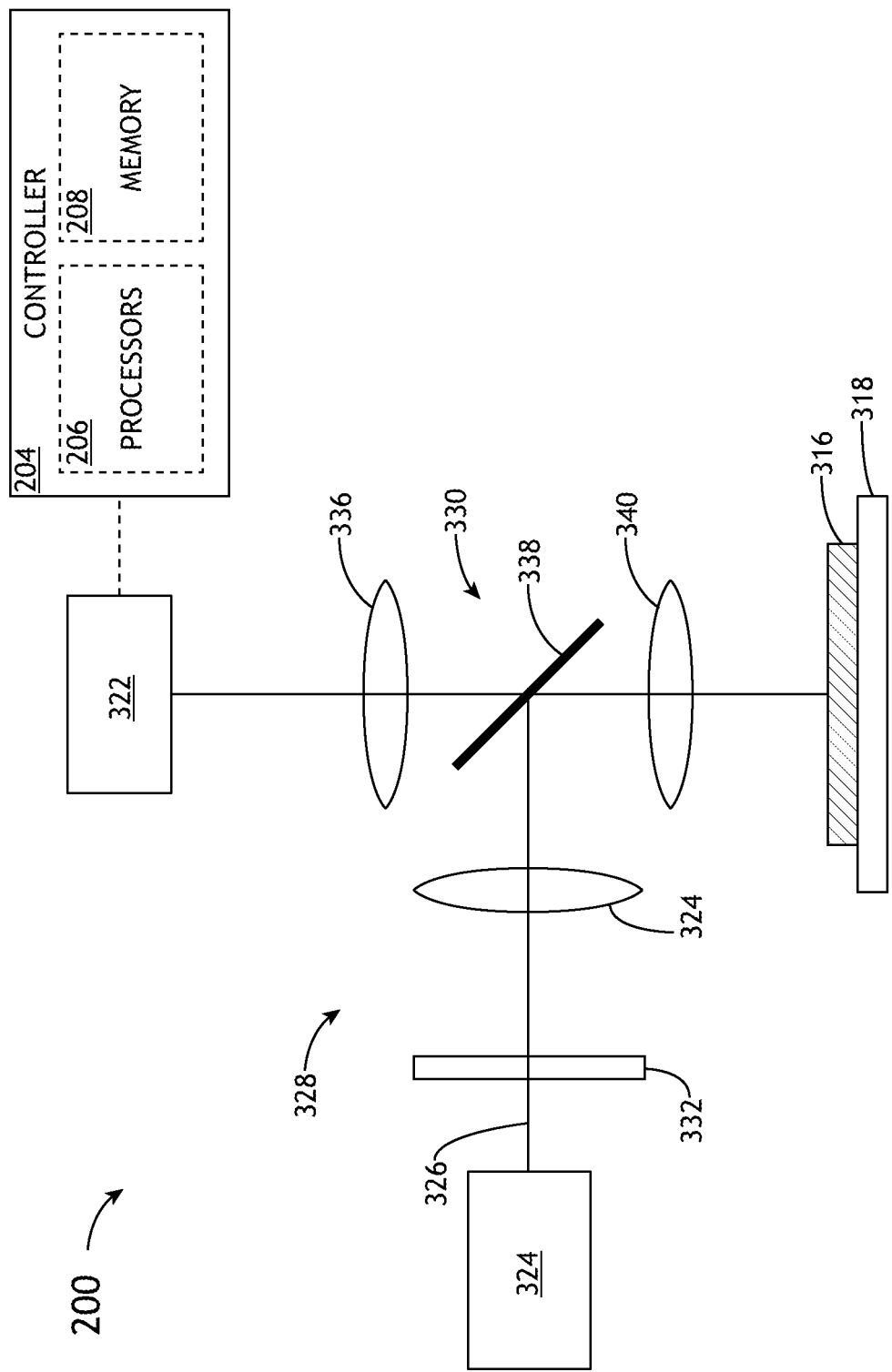

500

502 — FORMING A FIRST CELL, THE FIRST CELL COMPRISING A FIRST PORTION OF A FIRST SET OF PATTERN ELEMENTS, A FIRST PORTION OF A SECOND SET OF PATTERN ELEMENTS, AND A FIRST PORTION OF A THIRD SET OF PATTERN ELEMENTS ALONG A FIRST MEASUREMENT DIRECTION

504 — FORMING A SECOND CELL, THE SECOND CELL COMPRISING A SECOND PORTION OF THE FIRST SET OF PATTERN ELEMENTS, A SECOND PORTION OF THE SECOND SET OF PATTERN ELEMENTS, AND A SECOND PORTION OF THE THIRD SET OF PATTERN ELEMENTS ALONG A SECOND MEASUREMENT DIRECTION

FIG.5

ON-THE-FLY SCATTEROMETRY OVERLAY METROLOGY TARGET

TECHNICAL FIELD

The present disclosure is related generally to overlay metrology and, more particularly, for on-the-fly scatterometry overlay metrology.

BACKGROUND

Overlay metrology targets are typically designed to provide diagnostic information regarding the alignment of multiple layers of a sample by characterizing an overlay target having target features located on sample layers of interest. Further, the overlay alignment of the multiple layers is typically determined by aggregating overlay measurements of multiple overlay targets at various locations across the sample. Some overlay metrology targets (e.g., scatterometry overlay (SCOL) metrology targets) include periodic structures configured to produce diffraction patterns that may be analyzed to determine metrology measurements. The diffraction patterns are produced by illuminating the periodic structures along their measurement direction (e.g., perpendicularly to the elements of the grating). Typical SCOL metrology targets include periodic structures contained within a plurality of cells, where the periodic structures are configured for illumination along at least two measurement directions. However, typical SCOL metrology targets containing a plurality of cells occupy a larger surface area of a sample, and metrology measurements using such targets require more time when compared to SCOL metrology targets having cells configured for metrology measurement along a single measurement direction.

Therefore, it would be beneficial to have a SCOL metrology target having cells configured to metrology measurement along a single measurement direction.

SUMMARY

A metrology target is disclosed, in accordance with one or more embodiments of the present disclosure. In one embodiment, the metrology target includes a first cell. In another embodiment, the first cell includes a first portion of a first set of pattern elements formed along a first measurement direction, wherein the first set of pattern elements comprises segmented pattern elements having a first pitch. In another embodiment, the metrology target includes a first portion of a second set of pattern elements formed along the first measurement direction, wherein the second set of pattern elements comprises segmented pattern elements having a second pitch. In another embodiment, the metrology target includes a first portion of a third set of pattern elements formed along the first measurement direction, wherein the third set of pattern elements comprises segmented pattern elements having a third pitch.

A system is disclosed, in accordance with one or more embodiments of the present disclosure. In one embodiment, the system includes one or more controllers having one or more processors communicatively coupled to one or more metrology sub-systems, wherein the one or more processors are configured to execute a set of program instructions maintained in memory, wherein the set of program instructions is configured to cause the one or more processors to: receive, from the one or more metrology sub-systems, one or more signals indicative of illumination emanating from a first set of pattern elements, a second set of pattern elements, and a third set of pattern elements of one or more metrology targets of a sample, wherein the one or more metrology targets of the sample comprise: a first cell, the first cell comprising a first portion of a first set of pattern elements formed along a first measurement direction, wherein the first set of pattern elements comprises segmented pattern elements having a first pitch; a first portion of a second set of pattern elements formed along the first measurement direction, wherein the second set of pattern elements comprises segmented pattern elements having a second pitch; and a first portion of a third set of pattern elements formed along the first measurement direction, wherein the third set of pattern elements comprises segmented pattern elements having a third pitch; acquire a first overlay measurement based on the first set of pattern elements; acquire a second overlay measurement based on the second set of pattern elements; acquire a third overlay measurement based on the third set of pattern elements; and determine an overlay error based on at least two of the first overlay measurement, the second overlay measurement, or the third overlay measurement.

A method of measuring overlay is disclosed, in accordance with one or more embodiments of the present disclosure. In one embodiment, the method includes illuminating a sample having one or more metrology targets. In another embodiment, the method includes detecting one or more signals indicative of illumination emanating from a first set of pattern elements, a second set of pattern elements, and a third set of pattern elements of the one or more metrology targets of the sample, wherein the one or more metrology targets of the sample comprise a first cell, the first cell comprising a first portion of a first set of pattern elements formed along a first measurement direction, wherein the first set of pattern elements comprises segmented pattern elements having a first pitch; a first portion of a second set of pattern elements formed along the first measurement direction, wherein the second set of pattern elements comprises segmented pattern elements having a second pitch; and a first portion of a third set of pattern elements formed along the first measurement direction, wherein the third set of pattern elements comprises segmented pattern elements having a third pitch. In another embodiment, the method includes acquiring a first overlay measurement based on the one or more signals indicative of illumination emanating from the first set of pattern elements. In another embodiment, the method includes acquiring a second overlay measurement based on the one or more signals indicative of illumination emanating from the second set of pattern elements. In another embodiment, the method includes acquiring a third overlay measurement based on the one or more signals indicative of illumination emanating from the third set of pattern elements. In another embodiment, the method includes determining an overlay error based on at least one of the first overlay measurement, the second overlay measurement, or the third overlay measurement.

A method of forming a metrology target is disclosed, in accordance with one or more embodiments of the present disclosure. In one embodiment, the method includes forming a first cell, the first cell comprising a first portion of a first set of pattern elements formed along a first measurement direction, wherein the first set of pattern elements comprises segmented pattern elements having a first pitch; a first portion of a second set of pattern elements formed along the first measurement direction, wherein the second set of pattern elements comprises segmented pattern elements having a second pitch; and a first portion of a third set of pattern elements formed along the first measurement direction, wherein the third set of pattern elements comprises segmented pattern elements having a third pitch.

BRIEF DESCRIPTION OF DRAWINGS

The numerous advantages of the disclosure may be better understood by those skilled in the art by reference to the accompanying figures.

FIG. 2 is a conceptual view of a metrology system, in accordance with one or more embodiments of the present disclosure.

FIG. 3 illustrates a conceptual view of a metrology sub-system, in accordance with one or more embodiments of the present disclosure.

FIG. 5 is a process flow diagram depicting the steps of a method of forming a metrology target, in accordance with one or more embodiments of the present disclosure.

DETAILED DESCRIPTION

Figure 1A:
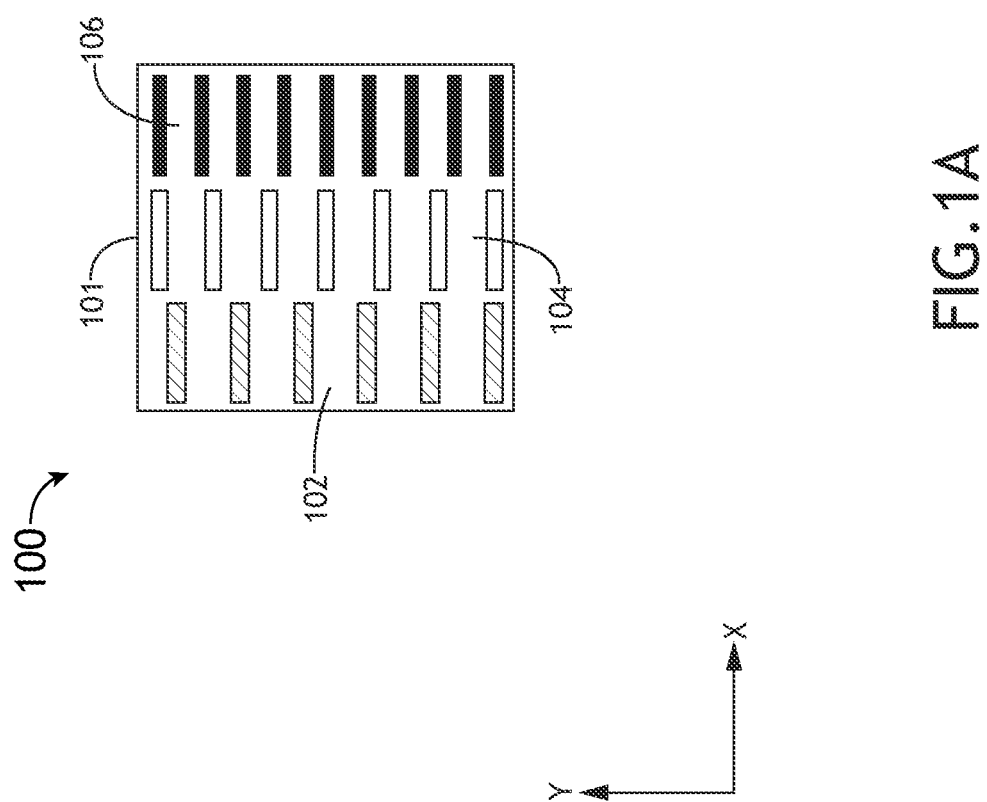
FIG. 1A is a top view of a metrology target, in accordance with one or more embodiments of the present disclosure.

A semiconductor device may be formed as multiple printed layers of patterned material on a substrate. Each printed layer may be fabricated through a series of process steps such as, but not limited to, one or more material deposition steps, one or more lithography steps, or one or more etching steps. In some fabrication processes, the printed layers may be formed using one or more photo resist materials. For example, a photo resist material may be deposited onto the substrate. The photo resist material may then be exposed to illumination, wherein the illumination produces a latent target pattern on the photo resist material. The latent target pattern (or a developed target pattern formed from the latent target pattern) may then be used as a pattern for one or more lithography and/or one or more etching steps configured to form a final target pattern on the substrate for use in overlay and/or metrology applications. In other fabrication processes, the photo resist material is exposed to illumination to produce a latent target pattern on the photo resist material, and the latent target pattern (or a developed target pattern formed from the latent target pattern) is used in overlay and/or metrology applications.

During fabrication, each printed layer must typically be fabricated within selected tolerances to properly construct the final device. For example, the relative placement of printed elements in each layer (e.g., the overlay or the overlay parameters) must be well characterized and controlled with respect to previously fabricated layers. Accordingly, metrology targets may be fabricated on one or more printed layers to enable efficient characterization of the overlay of the layers. Deviations of overlay target features on a printed layer may thus be representative of deviations of printed characteristics of printed device features on that layer. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

Metrology targets may typically include well-defined printed elements designed to provide an accurate representation of one or more printing characteristics. In this regard, measured characteristics of printed elements of a metrology target (e.g., by a metrology tool) may be representative of printed device elements associated with a device being fabricated. Further, metrology targets are typically characterized as having one or more measurement cells, where each cell includes printed elements in one or more layers on the sample. A metrology measurement may then be based on any combination of measurements of the size, orientation, or location (e.g., pattern placement) of printed elements in a single cell or between multiple cells. For example, one or more cells of an overlay metrology target may include printed elements on two or more sample layers arranged such that the relative positions of elements of each layer may be indicative of offset errors (e.g., pattern placement errors (PPE)) in a particular layer or overlay errors associated with registration errors between sample layers. By way of another example, process-sensitive metrology targets may include printed elements on a single sample layer, where one or more characteristics of the printed elements (e.g., width or critical dimension (CD), sidewall angle, position, or the like) are indicative of one or more process metrics including, without limitation, the dose of illumination during a lithography step or a focal position of the sample in a lithography tool during a lithography step.

Overlay metrology is typically performed by fabricating one or more overlay targets across a sample, where each overlay target includes features in sample layers of interest, which are fabricated at the same time as features associated with a device or component being fabricated. In this regard, overlay errors measured at a location of an overlay target may be representative of overlay errors of device features. Accordingly, overlay measurements may be used to monitor and/or control any number of fabrication tools to maintain production of devices according to specified tolerances. For example, overlay measurements of a current layer with respect to a previous layer on one sample may be utilized as feed-back data to monitor and/or mitigate deviations of the fabrication of the current layer on additional samples within a lot. By way of another example, overlay measurements of a current layer with respect to a previous layer on one sample may be utilized as feed-forward data to fabricate a subsequent layer on the same sample in a way that takes into account the existing layer alignments.

Overlay targets typically include features specifically designed to be sensitive to overlay errors between sample layers of interest. An overlay measurement may then be carried out by characterizing the overlay target using an overlay metrology tool and applying an algorithm to determine overlay errors on the sample based on the output of the metrology tool.

Regardless of the overlay measurement technique, an overlay metrology tool is typically configurable according to a recipe including a set of measurement parameters utilized to generate an overlay signal. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like. Accordingly, an overlay recipe may include a set of measurement parameters for generating an overlay signal suitable for determining overlay of two or more sample layers.

Overlay metrology tools may utilize a variety of techniques to determine the overlay of sample layers. For example, image-based overlay metrology tools may illuminate an overlay target (e.g., an advanced imaging metrology (AIM) target, a box-in-box metrology target, or the like) and capture an overlay signal including an image of overlay target features located on different sample layers. Accordingly, overlay may be determined by measuring the relative positions of the overlay target features. By way of another example, scatterometry-based overlay metrology tools may illuminate an overlay target (e.g., a grating-over-grating metrology target, or the like) and capture an overlay signal including an angular distribution of radiation emanating from the overlay target associated with diffraction, scattering, and/or reflection of the illumination beam. Accordingly, overlay may be determined based on models of the interaction of an illumination beam with the overlay target.

It is recognized herein that various overlay metrology tools may be used to measure overlay. For example, optical metrology tools (e.g., light-based metrology tools using electromagnetic radiation for illumination and/or detection) may provide high-throughput overlay measurements using numerous techniques such as, but not limited to, determining relative positions of spatially-separated features on multiple layers in an image, directly measuring PPE on multiple layers, or scatterometry in which overlay is determined based on light scattered and/or diffracted from diffraction gratings on multiple layers. For the purposes of the present disclosure, the term "optical metrology tools," "optical metrology techniques," and the like indicate metrology tools and techniques using electromagnetic radiation of any wavelength such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths. Systems, methods, and apparatuses related to overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Patent Publication No. 2013/0035888 titled "METHOD AND SYSTEM FOR PROVIDING A QUALITY METRIC FOR IMPROVED PROCESS CONTROL" and published on Feb. 7, 2013, U.S. Pat. No. 9,214,317 titled "SYSTEM AND METHOD OF SEM OVERLAY METROLOGY" issued on Dec. 15, 2015, U.S. Pat. No. 10,527,951 B2 titled "COMPOUND IMAGING METROLOGY TARGETS" issued on Jan. 7, 2020, U.S. Pat. No. 10,190,979 B2 titled "METROLOGY IMAGING TARGETS HAVING REFLECTION-SYMMETRIC PAIRS OF REFLECTION-ASYMMETRIC STRUCTURES" issued on Jan. 29, 2019, and PCT Application No. PCT/US2016/039531 titled "APPARATUS AND METHOD FOR THE MEASUREMENT OF PATTERN PLACEMENT AND SIZE OF PATTERN AND COMPUTER PROGRAM THEREFOR" and filed on Jun. 27, 2016, all of which are incorporated herein by reference in their entirety.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a top view of a metrology target 100, in accordance with one or more embodiments of the present disclosure. The metrology target 100 may include a first cell 101. The first cell 101 may include a first portion 102a of a first set of pattern elements 102. The first set of pattern elements 102 may be compatible with any metrology mode known in the art, including, without limitation, any scatterometry-based overlay (SCOL) metrology mode. In this regard, the first set of pattern elements 102 may be configured to include periodic and/or segmented structures for metrology using SCOL-based metrology methods (e.g., grating-over-grating structures, or any structure known in the art to be suitable for diffracting, scattering, and/or reflecting an illumination beam). The first set of pattern elements 102 may have a first pitch (e.g., a periodic distance between repeated reference features of the first set of pattern elements 102). By way of another example, the first set of pattern elements 102 may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of overlay target features located on different sample layers). The first portion 102a of the first set of pattern elements 102 may be configured for metrology along a first measurement direction. For example, the first portion 102a of the first set of pattern elements 102 may be configured for measurement along a y-direction.

The first cell 101 may include a first portion 104a of a second set of pattern elements 104. The second set of pattern elements 104 may be compatible, along the first measurement direction, with any metrology mode known in the art, including, without limitation, any scatterometry-based overlay (SCOL) metrology mode. In this regard, the second set of pattern elements 104 may be configured to include periodic and/or segmented structures for metrology using SCOL-based metrology methods (e.g., grating-over-grating structures, or any structure known in the art to be suitable for diffracting, scattering, and/or reflecting an illumination beam). The second set of pattern elements 104 may have a second pitch (e.g., a periodic distance between repeated reference features of the second set of pattern elements 104). By way of another example, the second set of pattern elements 104 may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of overlay target features located on different sample layers). It is specifically noted that, in some embodiments, the second pitch may not be equivalent to the first pitch.

The first cell 101 may include a first portion 106a of a third set of pattern elements 106. The third set of pattern elements 106 may be compatible, along the first measurement direction, with any metrology mode known in the art, including, without limitation, any scatterometry-based overlay (SCOL) metrology mode. In this regard, the third set of pattern elements 106 may be configured to include periodic and/or segmented structures for metrology using SCOL-based metrology methods (e.g., grating-over-grating structures, or any structure known in the art to be suitable for diffracting, scattering, and/or reflecting an illumination beam). The third set of pattern elements 106 may have a third pitch (e.g., a periodic distance between repeated reference features of the third set of pattern elements 106). By way of another example, the third set of pattern elements 106 may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of overlay target features located on different sample layers). The third set of pattern elements 106 may have a third pitch. It is specifically noted that, in some embodiments, the third pitch may not be equivalent to either the first pitch or the second pitch.

Figure 1B:
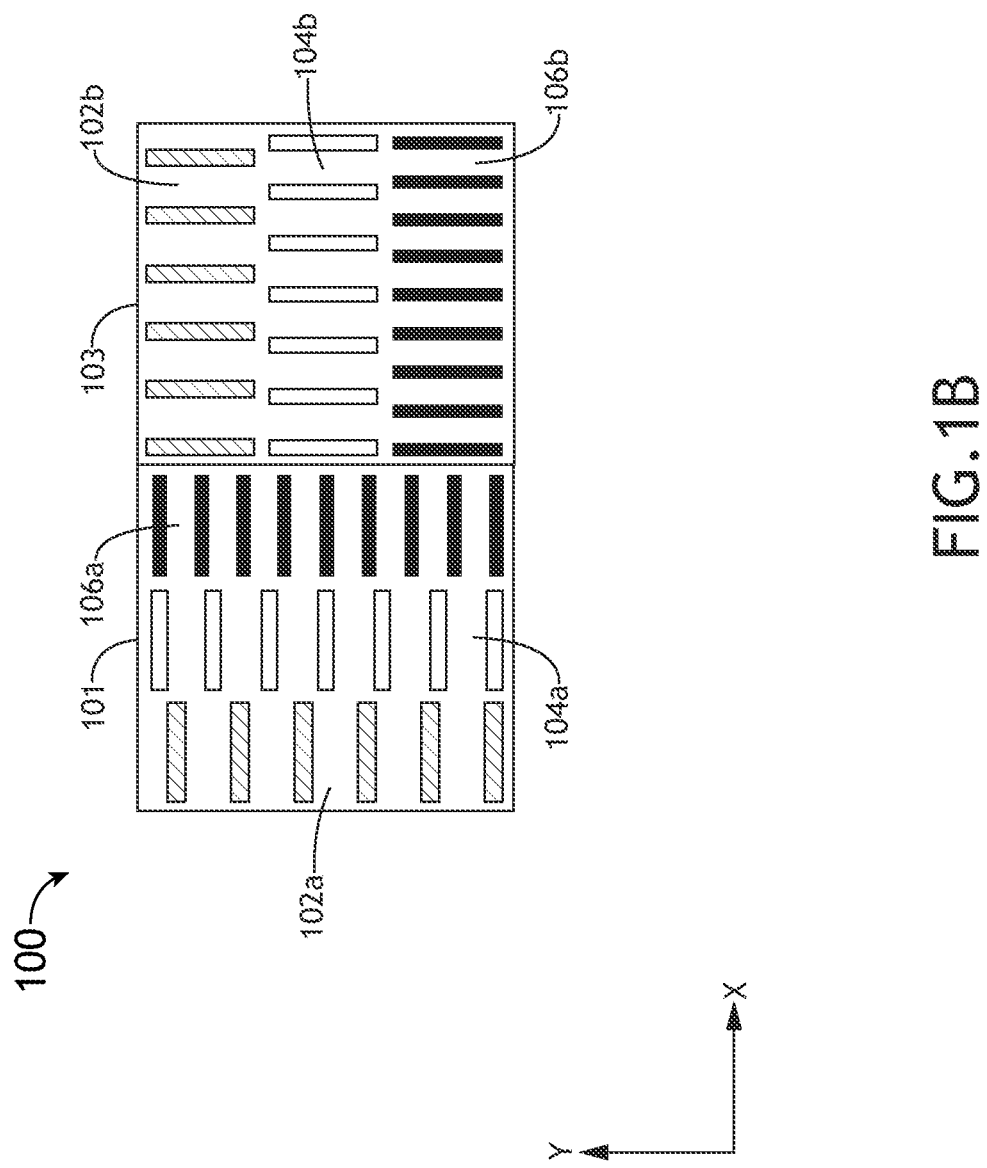
FIG. 1B is a top view of a metrology target, in accordance with one or more embodiments of the present disclosure.

FIG. 1B is a top view of a metrology target 100, in accordance with one or more embodiments of the present disclosure. The metrology target 100 may include a second cell 103. The second cell 103 may include a second portion 102b of the first set of pattern elements 102. The second portion 102b of the first set of pattern elements 102 may be configured for metrology along a second measurement direction. For example, the second portion 102b of the first set of pattern elements 102 may be configured for measurement along an x-direction. The second cell 103 may include a second portion 104b of the second set of pattern elements 104. The second portion 104b of the second set of pattern elements 104 may be configured for metrology along the second measurement direction. The second cell 103 may include a second portion 106b of the third set of pattern elements 106. The second portion 106b of the third set of pattern elements 106 may be configured for metrology along the second measurement direction.

The first cell 101 and the second cell 103 may be formed such that the first cell 101 and the second cell 103 are adjacent to each other. For example, as shown in FIG. 1B, the second cell 103 may be formed to a side of the first cell 101. It is noted that each of the first cell 101 and the second cell 103 may be configured such that each of the first measurement direction and the second measurement direction are perpendicular to each other. In this regard, the first cell 101 and the second cell 103 may be four-fold rotationally symmetric. In another embodiment, the first cell 101 and the second cell 103 may be two-fold rotationally symmetric. In some embodiments, the size of the first cell 101 and/or the second cell 103 may permit the metrology target 100 to be used in small areas of a sample. For example, in some embodiments, the metrology target 100 may be configured to include only the first cell 101 in order to comply with space considerations with respect to the sample. In other embodiments, the metrology target 100 may be configured to include only the second cell 103 in order to comply with space considerations with respect to the sample. In other embodiments, the metrology target 100 may be configured to include both the first cell 101 and the second cell 103 in order to comply with space considerations with respect to the sample.

Figure 1C:
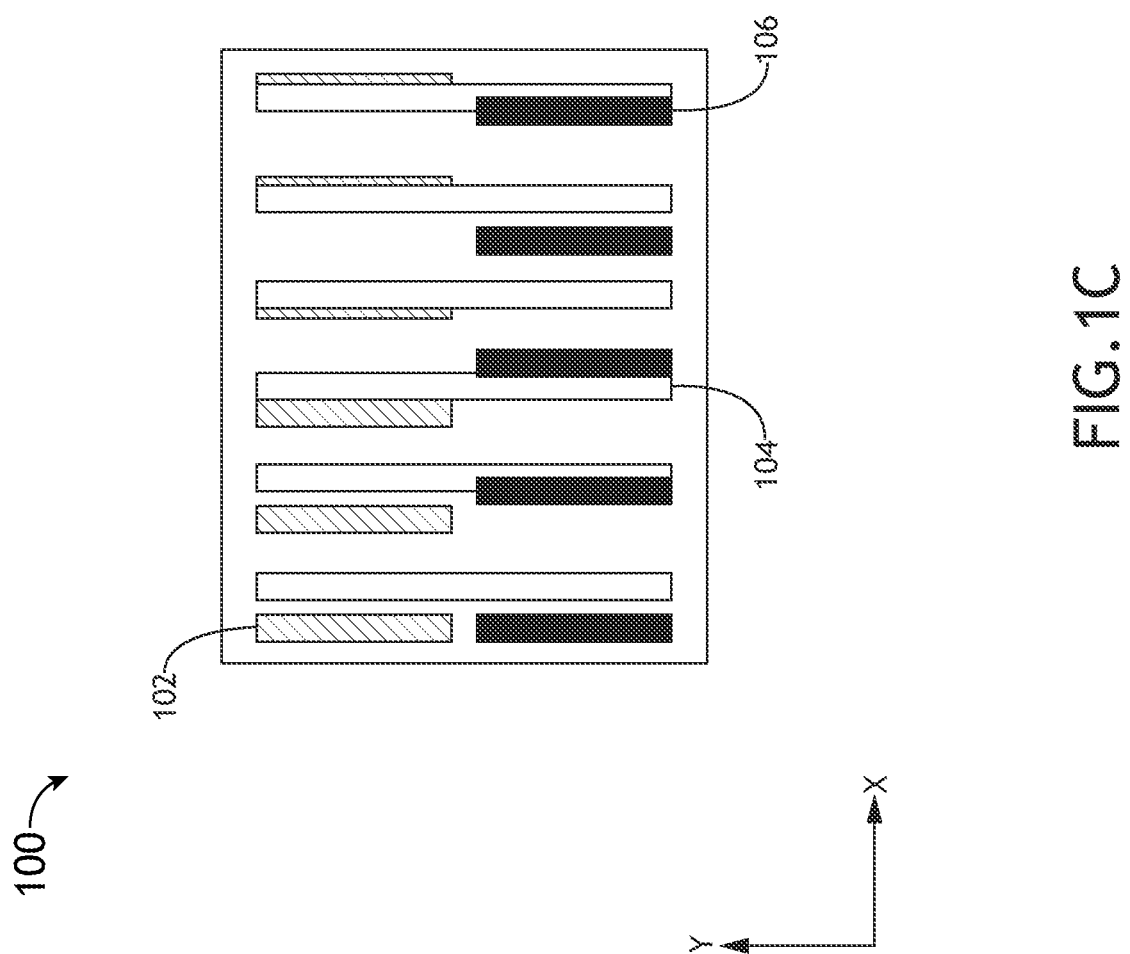
FIG. 1C is a top view of a metrology target, in accordance with one or more embodiments of the present disclosure.
Figure 1D:
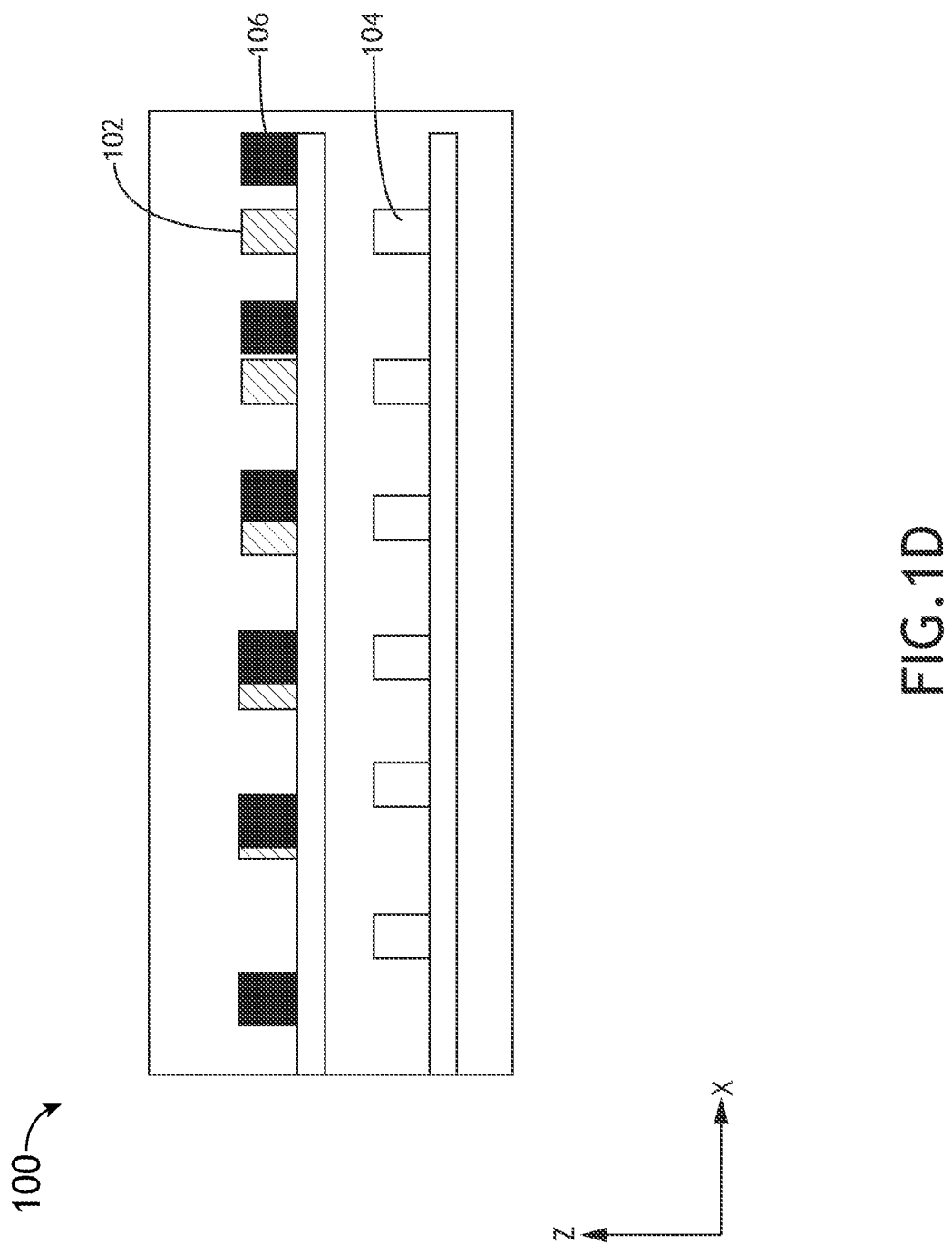
FIG. 1D is a side view of a metrology target, in accordance with one or more embodiments of the present disclosure.

In some embodiments, as shown in FIGS. 1C and 1D, the metrology target 100 may be configured to occupy a smaller amount of surface area on a sample. For example, the metrology target 100 may be configured such that the first cell 101 and the second cell 103 form a "grating-over-grating" structure. By way of another example, the first cell 101 may be formed in a first layer of the metrology target 100, and the second cell 103 may be formed in a second layer of the metrology target 100. In this regard, the second cell 103 may be formed on top (e.g., along a z-direction) of the first cell 101 such that each of the first portion of the first set of pattern elements 102a, the first portion of the second set of pattern elements 104a, and the first portion of the third set of pattern elements 106a, may form a "grating-over-grating" structure that occupies a smaller surface area on the sample.

It is noted that the pattern elements of the metrology target 100 (e.g., the first cell 101 and/or the second cell 103) may be configured such that incident radiation directed to one or more portions of the first cell pattern elements 108 and/or the second cell pattern elements 112 may be diffracted by the one or more portions of the first set of pattern elements 102, the second set of pattern elements 104, and/or the third set of pattern elements 106, and the diffracted radiation may be detected and analyzed (e.g., by one or more metrology sub-systems) to determine one or more overlay measurements based on the diffracted radiation and/or one or more signals indicative of the diffracted radiation.

It is noted that the embodiments of the present disclosure, including, without limitation, the components of the metrology target 100 (e.g., the first cell 101, the second cell 103, the first set of pattern elements 102, the second set of pattern elements 104, and/or the third set of pattern elements 106) may be configured to reduce an amount of time required to perform an overlay measurement. For example, the configuration of the first cell 101, in that each of the first portion of the first set of pattern elements 102a, the first portion of the second set of pattern elements 104a, and the first portion of the third set of pattern elements 106a is configured for measurement along the first measurement direction, may reduce the time required for one or more portions of a metrology sub-system to capture a signal from each of the pattern elements of the first cell 101. In this regard, by forming each of the portions of pattern elements of the first cell 101 along the first measurement direction, a metrology sub-system may capture signals from such pattern elements without adjusting one or more measurement parameters related to the measurement direction (i.e., the metrology sub-system may receive a signal from the metrology target 100 along only one measurement direction with respect to a given cell).

FIG. 2 illustrates a simplified block diagram of a metrology system 200, in accordance with one or more embodiments of the present disclosure. In one embodiment, the metrology system 200 includes one or more metrology sub-systems 202 The one or more metrology sub-systems 202 may be configured to operate in either an imaging more or a non-imaging mode. For example, in an imaging mode, individual overlay target elements may be resolvable within the illuminated spot on the sample (e.g., as part of a bright-field image, a dark-field image, a phase-contrast image, or the like). By way of another example, the one or more metrology sub-systems 202 may operate as a scatterometry-based overlay (SCOL) metrology tool in which radiation from the sample is analyzed at a pupil plane to characterize the angular distribution of radiation from the sample (e.g., associated with scattering and/or diffraction of radiation by the sample).

The one or more metrology sub-systems 202 may direct illumination to a sample and may further collect radiation emanating from the sample to generate an overlay signal suitable for the determination of overlay of two or more sample layers. The one or more metrology sub-systems may include any type of overlay metrology tool known in the art suitable for generating overlay signals suitable for determining overlay associated with overlay targets on a sample, including, without limitation, any optical metrology tool (e.g., an advanced imaging metrology (AIM) tool, an advanced imaging metrology in-die (AIMid) tool, a triple advanced imaging metrology (Triple AIM) tool, and the like), any particle-based metrology tool (e.g., an electron-beam metrology tool), or a scatterometry-based overlay (SCOL) metrology tool. It is noted that the embodiments of the present disclosure are not limited to a metrology system 200 having only one metrology sub-system 202, and that the metrology system 200 may include at least two metrology sub-systems. For example, the metrology system 200 may include an optical metrology tool and a scatterometry-based overlay (SCOL) metrology tool.

The one or more metrology sub-systems 202 may be configurable to generate overlay signals based on any number of recipes defining measurement parameters for the acquiring an overlay signal suitable for determining overlay of an overlay target. For example, a recipe the one or more metrology sub-systems 202 may include, but are not limited to, an illumination wavelength, a detected wavelength of radiation emanating from the sample, a spot size of illumination on the sample, an angle of incident illumination, a polarization of incident illumination, wave plan of the incident beam, a position of a beam of incident illumination on an overlay target, a position of an overlay target in the focal volume of the overlay metrology tool, or the like.

In another embodiment, the overlay metrology system 200 includes a controller 204 communicatively coupled to the one or more metrology sub-systems 202. The controller 204 may be configured to direct the one or more metrology sub-systems 202 to generate overlay signals based on one or more selected recipes. The controller 204 may be further configured to receive data including, but not limited to, overlay signals from the one or more metrology sub-systems 202. Additionally, the controller 204 may be configured to determine overlay associated with an overlay target based on the acquired overlay signals.

In another embodiment, the controller 204 includes one or more processors 206. For example, the one or more processors 206 may be configured to execute a set of program instructions maintained in a memory device 208, or memory. The one or more processors 206 of a controller 204 may include any processing element known in the art. In this sense, the one or more processors 206 may include any microprocessor-type device configured to execute algorithms and/or instructions. Further, the memory device 208 may include any storage medium known in the art suitable for storing program instructions executable by the associated one or more processors 206. For example, the memory device 208 may include a non-transitory memory medium. As an additional example, the memory device 208 may include, but is not limited to, a read-only memory, a random-access memory, a magnetic or optical memory device (e.g., disk), a magnetic tape, a solid-state drive and the like. It is further noted that memory device 208 may be housed in a common controller housing with the one or more processors 206.

In one embodiment, the metrology sub-system 202 may direct illumination to a sample and may further collect radiation emanating from the sample to generate an overlay signal suitable for the determination of overlay of two or more sample layers. The metrology sub-system 202 may be configurable to generate overlay signals based on any number of recipes defining measurement parameters for the acquiring an overlay signal suitable for determining overlay of an overlay target. For example, a recipe the metrology sub-system 202 may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like.

In one embodiment, as shown in FIG. 3 the one or more metrology sub-systems 202 may include an optical metrology sub-system 202, such as a metrology sub-system including an optical metrology tool. The optical metrology sub-system 202 may include any type of optical metrology tool known in the art suitable for generating metrology data of a sample, including, without limitation, an optical metrology tool configured to generate and/or detect an optical illumination beam having x-ray, ultraviolet (UV), infrared (IR), or visible light wavelengths. By way of another example, the one or more metrology sub-systems 202 may include an advanced imaging metrology (AIM) tool, an advanced imaging metrology in-die (AIMid) tool, or a triple advanced imaging metrology (Triple AIM) tool.

In one embodiment, the one or more metrology sub-systems 202 may include an optical illumination source 324 configured to generate an optical illumination beam 326. The optical illumination beam 326 may include one or more selected wavelengths of radiation including, but not limited to, x-ray, ultraviolet (UV) light, visible light, or infrared (IR) light.

The optical illumination source 324 may include any type of illumination source suitable for providing an optical illumination beam 326. In one embodiment, the optical illumination source 324 is a laser source. For example, the optical illumination source 324 may include, but is not limited to, one or more narrowband laser sources, a broadband laser source, a supercontinuum laser source, a white light laser source, or the like. In this regard, the optical illumination source 324 may provide an optical illumination beam 326 having high coherence (e.g., high spatial coherence and/or temporal coherence). In another embodiment, the optical illumination source 324 includes a laser-sustained plasma (LSP) source. For example, the optical illumination source 324 may include, but is not limited to, a LSP lamp, a LSP bulb, or a LSP chamber suitable for containing one or more elements that, when excited by a laser source into a plasma state, may emit broadband illumination. In another embodiment, the optical illumination source 324 includes a lamp source. For example, the optical illumination source 324 may include, but is not limited to, an arc lamp, a discharge lamp, an electrode-less lamp, or the like. In this regard, the optical illumination source 324 may provide an optical illumination beam 326 having low coherence (e.g., low spatial coherence and/or temporal coherence).

In another embodiment, the optical illumination source 324 directs the optical illumination beam 326 to the sample 316 via an illumination pathway 328. The illumination pathway 328 may include one or more illumination pathway lenses 334 or additional optical components 332 suitable for modifying and/or conditioning the optical illumination beam 326. For example, the one or more optical components 332 may include, but are not limited to, one or more polarizers, one or more filters, one or more beam splitters, one or more diffusers, one or more homogenizers, one or more apodizers, or one or more beam shapers. The illumination pathway 326 may further include an objective lens 338 configured to direct the optical illumination beam 326 to the sample 316.

In another embodiment, the sample 316 is disposed on a sample stage 318. The sample stage 318 may include any device suitable for positioning and/or scanning the sample 318 within the one or more metrology sub-systems 202b. For example, the sample stage 316 may include any combination of linear translation stages, rotational stages, tip/tilt stages, or the like.

In another embodiment, the one or more metrology sub-systems 202 include one or more detectors 322 configured to capture light emanating from the sample 316 through a collection pathway 330. The collection pathway 330 may include, but is not limited to, one or more collection pathway lenses 326, 340 for collecting light from the sample 316. For example, the one or more detectors 322 may receive light reflected or scattered (e.g., via specular reflection, diffuse reflection, and the like) from the sample 316 via one or more collection pathway lenses 326, 340. By way of another example, the one or more detectors 322 may receive light generated by the sample 316 (e.g., luminescence associated with absorption of the optical illumination beam 326, or the like). By way of another example, the one or more detectors 322 may receive one or more diffracted orders of light from the sample 316 (e.g., 0-order diffraction, ±1 order diffraction, ±2 order diffraction, and the like).

It is noted that the one or more detectors 322 may be configured to simultaneously capture light emanating from a plurality of portions of the sample 316, such as the first set of pattern elements 102, the second set of pattern elements 104, and/or the third set of pattern elements 106. In this way, the metrology system 200 may be configured such that the amount of time required to determine an overlay error is reduced in that operation of the metrology system 200 may be performed "on-the-fly" and the operation need not be discontinued between each individual overlay measurement.

The one or more detectors 322 may include any type of detector known in the art suitable for measuring illumination received from the sample 316. For example, a detector 322 may include, but is not limited to, a CCD detector, a TDI detector, a photomultiplier tube (PMT), an avalanche photodiode (APD), a complementary metal-oxide-semiconductor (CMOS) sensor, or the like. In another embodiment, a detector 322 may include a spectroscopic detector suitable for identifying wavelengths of light emanating from the sample 316.

In one embodiment, the one or more detectors 322 are positioned approximately normal to the surface of the sample 316. In another embodiment, the one or more metrology sub-systems 202 includes a beamsplitter oriented such that the objective lens 338 may simultaneously direct the optical illumination beam 326 to the sample 316 and collect light emanating from the sample 316. Further, the illumination pathway 326 and the collection pathway 330 may share one or more additional elements (e.g., objective lens 338, apertures, filters, or the like).

As previously described, the one or more metrology sub-systems 202 may include a controller 204 communicatively coupled to the one or more metrology sub-systems 202. The controller 204 may be configured to direct the one or more metrology sub-systems 204 to generate overlay signals based on one or more selected recipes. The controller 204 may be further configured to receive data including, but not limited to, overlay signals from the one or more metrology sub-systems 202. Additionally, the controller 204 may be configured to determine overlay associated with an overlay target based on the acquired overlay signals.

The controller 204 may be configured to determine an overlay value of the sample 316 based on one or more overlay measurements of the sample. For example, the controller 204 may be configured to generate one or more overlay measurements of the sample 316 based on one or more signals indicative of illumination emanating from one or more portions of the sample 316 (e.g., the first set of pattern elements 102, the second set of pattern elements 104, and/or the third set of pattern elements 106). The one or more overlay measurements of the sample 202 may correspond to an overlay position of one or more layers of the sample 316.

The one or more overlay measurements of the sample 316 may include one or more measurements of intensity of illumination emanating from the first set of pattern elements 102, the second set of pattern elements 104, and/or the third set of pattern elements 106. For example, the controller 204 may be configured to determine an intensity of illumination collected by the one or more detectors 322 (and/or the particle detector 320). By way of another example, the controller 204 may be configured to determine the intensity of illumination emanating from the first set of pattern elements 102 (having a pitch $P_1$), the second set of pattern elements 104 (having a pitch $P_2$), and/or the third set of pattern elements 106 (having a pitch $P_3$), as the sample 316 is moved at a velocity v (e.g., such as through translation of the stage 318), according to Equation 1.

$$I_{\pm 1} = |A_1 e^{\pm 2\pi i (x_1 + vt)/P_1 + i\phi_1} + A_2 e^{\pm 2\pi i (x_2 + vt)/P_2 + i\phi_2} + A_3 e^{\pm 2\pi i (x_3 + vt)/P_3 + i\phi_3}|^2 \quad \text{Eqn. 1}$$

It is noted that the intensity determined by the controller 204 using Eqn. 1 is shown in the context of illumination having a +1-diffraction order. It is expressly contemplated that the embodiments of the present disclosure are not limited to such context, and that the controller 204 may be configured to determine intensity of illumination emanating from the sample 316 having various diffraction orders (e.g., a −1-diffraction order).

The controller 204 may be configured to further determine a relative variation in intensity of illumination emanating from various portions of the sample 316 (e.g., a difference in intensity between illumination emanating from the first set of pattern elements 102, and second set of pattern elements 104, and/or the third set of pattern elements 106). For example, the controller 204 may determine an intensity variation between illumination emanating from the first set of pattern elements 102, and second set of pattern elements 104, and/or the third set of pattern elements 106 according to Equation 2.

$$I_{+1} = A_1 A_2 e^{i\{(\phi_1-\phi_2)\pm 2\pi[(x_1/P_1-x_2/P_2)+vt(1/P_1-1/P_2)]\}} +$$
$$A_2 A_3 e^{i\{(\phi_2-\phi_3)\pm 2\pi[(x_2/P_2-x_3/P_3)+vt(1/P_2-1/P_3)]\}} +$$
$$A_1 A_3 e^{i\{(\phi_1-\phi_3)\pm 2\pi[(x_1/P_1-x_3/P_3)+vt(1/P_1-1/P_3)]\}}$$ Eqn. 2

It is noted that the intensity determined by the controller 204 using Eqn. 2 is shown in the context of illumination having a +1-diffraction order. It is expressly contemplated that the embodiments of the present disclosure are not limited to such context, and that the controller 104 may be configured to determine intensity of illumination emanating from the sample 316 having various diffraction orders (e.g., a −1-diffraction order).

The controller 204 may be further configured to determine a phase difference with respect to illumination emanating from the first set of pattern elements 102, and second set of pattern elements 104, and/or the third set of pattern elements 106). For example, the controller 104 may determine an phase difference between illumination emanating from the first set of pattern elements 102 and second set of pattern elements 104 (such phase difference denoted by $\delta_{12\ 12}$), the second set of pattern elements 104 and the third set of pattern elements 106 (such phase difference denoted by $\delta_{12\ 23}$), and/or the first set of pattern elements 102 and the third set of pattern elements 106 such phase difference denoted by $\delta_{12\ 13}$) according to Equation 3.

$$\frac{x_1}{P_1} - \frac{x_2}{P_2} = \delta_{12}$$ Eqn. 3
$$\frac{x_2}{P_2} - \frac{x_3}{P_3} = \delta_{23}$$
$$\frac{x_1}{P_1} - \frac{x_3}{P_3} = \delta_{13}$$

The controller 104 may be further configured to determine an overlay value (e.g., an overlay error) between two layers of the sample 316 based on the phase differences computed according to Equation 3. For example, the controller 204 may be configured to determine an overlay error between a first layer of the sample 316 and a second layer of the sample 316 (e.g., $OVL_{1-2}$), according to Equation 4.

$$OVL_{1-2} = x_1 - x_2 = P_2 \frac{\delta_{12} - \frac{P_3}{P_1}\frac{P_2-P_1}{P_3-P_2}\delta_{23}}{1 + \frac{P_3}{P_1}\frac{P_2-P_1}{P_3-P_2}}$$ Eqn. 4

The one or more processors 206 of the controller 204 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 206 may include any device configured to execute algorithms and/or instructions (e.g., program instructions stored in memory). In one embodiment, the one or more processors 206 may be embodied as a desktop computer, mainframe computer system, workstation, image computer, parallel processor, networked computer, or any other computer system configured to execute a program configured to operate or operate in conjunction with the metrology system 200, as described throughout the present disclosure. Further, the steps described throughout the present disclosure may be carried out by a single controller 204 or, alternatively, multiple controllers. Additionally, the controller 204 may include one or more controllers housed in a common housing or within multiple housings. In this way, any controller or combination of controllers may be separately packaged as a module suitable for integration into metrology system 200. Further, the controller 204 may analyze data received from the one or more metrology sub-systems 202 and feed the data to additional components within the metrology system 200 or external to the metrology system 200.

The memory medium 208 may include any storage medium known in the art suitable for storing program instructions executable by the associated one or more processors 204. For example, the memory medium 208 may include a non-transitory memory medium. By way of another example, the memory medium 208 may include, but is not limited to, a read-only memory (ROM), a random-access memory (RAM), a magnetic or optical memory device (e.g., disk), a magnetic tape, a solid-state drive and the like. It is further noted that memory medium 208 may be housed in a common controller housing with the one or more processors 206. In one embodiment, the memory medium 208 may be located remotely with respect to the physical location of the one or more processors 206 and controller 204. For instance, the one or more processors 206 of controller 204 may access a remote memory (e.g., server), accessible through a network (e.g., internet, intranet and the like).

In one embodiment, a user interface (not shown) is communicatively coupled to the controller 204. The user interface may include, but is not limited to, one or more desktops, laptops, tablets, and the like. In another embodiment, the user interface includes a display used to display data of the metrology system 200 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

In another embodiment, the controller 204 is communicatively coupled to one or more elements of the metrology system 200. In this regard, the controller 204 may transmit and/or receive data from any component of the metrology system 200. For example, the controller 204 may be communicatively coupled to the detector 320, 322 to receive one or more images from the detector 320, 322. Further, the controller 204 may direct or otherwise control any component of the metrology system 200 by generating one or more control signals for the associated components.

Figure 4:
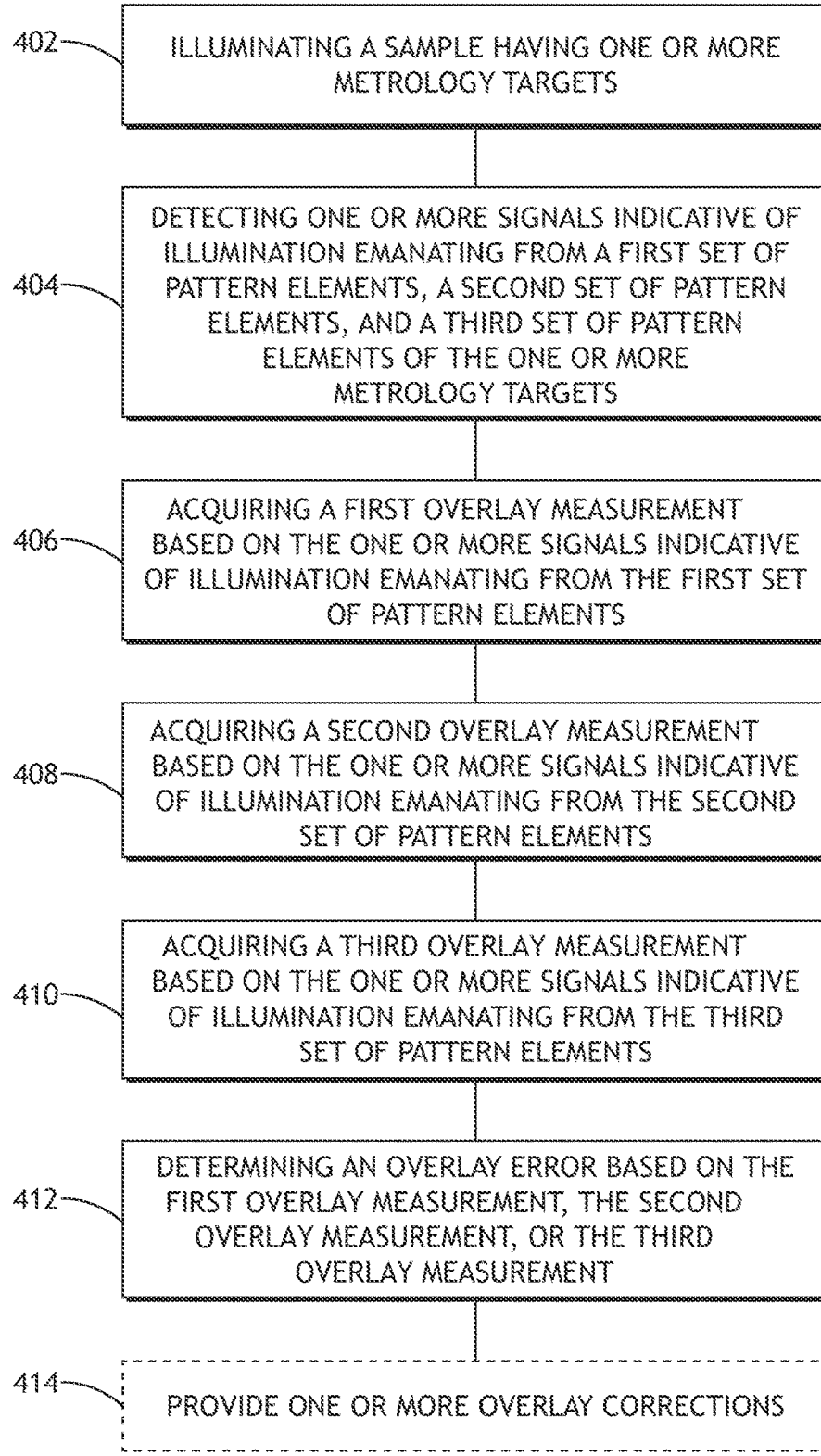
FIG. 4 is a process flow diagram depicting the steps of a method of measuring overlay of a sample, in accordance with one or more embodiments of the present disclosure.

FIG. 4 illustrates a process flow diagram depicting the steps of a method 400 of measuring overlay of a sample, in accordance with one or more embodiments of the present disclosure.

In Step 402, a sample including one or more metrology targets 100 is illuminated. For example, the metrology system 200 may direct an illumination beam onto the sample 316. As used herein, the term "illumination beam" may refer to any radiant beam, including, without limitation, the optical illumination beam 326.

In Step 404, illumination emanating from the first set of pattern elements 102, the second set of pattern elements 104, and the third set of pattern elements 106 of the metrology target 100 is detected. For example, the optical illumination beam 326 may be detected.

In Step 406, one or more first overlay measurements are generated. For example, the controller 204 may be configured to generate one or more first overlay measurements of the sample 316 based on one or more signals indicative of illumination emanating from one or more portions of the first set of pattern elements 102. The one or more first overlay measurements of the sample 316 may include one or more intensity measurements (e.g., the controller 204 may determine one or more intensities and/or phase differences according to Eqns. 1-3).

In Step 408, one or more second overlay measurements are generated. For example, the controller 204 may be configured to generate one or more second overlay measurements of the sample 316 based on one or more signals indicative of illumination emanating from one or more portions of the second set of pattern elements 104. The one or more second overlay measurements of the sample 316 may include one or more intensity measurements (e.g., the controller 204 may determine one or more intensities and/or phase differences according to Eqns. 1-3).

In Step 410, one or more third overlay measurements are generated. For example, the controller 204 may be configured to generate one or more third overlay measurements of the sample 316 based on one or more signals indicative of illumination emanating from one or more portions of the third set of pattern elements 106. The one or more third overlay measurements of the sample 316 may include one or more intensity measurements (e.g., the controller 204 may determine one or more intensities and/or phase differences according to Eqns. 1-3).

In Step 412, an overlay error is determined based on the one or more first overlay measurements, the one or more second overlay measurements, and/or the one or more third overlay measurements. For example, the controller 204 may be configured to generate an overlay error between a first layer of the sample 316 and a second layer of the sample 316 using Eqn. 4.

In some embodiments, the method 400 may include one or more additional steps (e.g., optional Step 414) wherein one or more overlay correctables are provided based on the one or more overlay values determined in at least Step 412. For example, the one or more additional steps may include the controller 204 generating one or more control signals (or corrections to the control signals) for adjusting one or more parameters (e.g., fabrication settings, configuration, and the like) of one or more process tools (e.g., lithographic tools). The control signals (or corrections to the control signals) may be provided by the controller 204 as part of a feedback and/or feedforward control loop. The controller 204 may cause the one or more process tools to execute one or more adjustments to the one or more parameters of the one or more process tools based on the one or more control signals (or corrections to the control signals). In some embodiments, the controller 204 may alert a user to make the one or more adjustments. In this sense, the one or more control signals may compensate for errors of one or more fabrication processes of the one or more process tools, and thus may enable the one or more process tools to maintain overlay within selected tolerances across multiple exposures on subsequent samples in the same or different lots.

FIG. 5 illustrates a process flow diagram illustrating the steps of a method 500 of forming a metrology target 100, in accordance with one or more embodiments of the present disclosure.

In Step 502, a first set of pattern elements 102 is formed within a first cell 101 and a second cell 103 of a sample. For example, the first portion of the first set of pattern elements 102 may be formed within the first cell 101, and the second portion of the first set of pattern elements 102 may be formed within the second cell 103. The first set of pattern elements 102 may be fabricated through one or more process steps such as, but not limited to, one or more deposition, lithographic, or etching steps. The first set of pattern elements 102 may be formed using one or more process tools (e.g., lithographic tools).

In Step 504, a second set of pattern elements 104 is formed within a first cell 101 and a second cell 103 of a sample. For example, the first portion of the second set of pattern elements 104 may be formed within the first cell 101, and the second portion of the second set of pattern elements 104 may be formed within the second cell 103. The second set of pattern elements 104 may be fabricated through one or more process steps such as, but not limited to, one or more deposition, lithographic, or etching steps. The second set of pattern elements 104 may be formed using one or more process tools (e.g., lithographic tools).

In Step 506, a third set of pattern elements 106 is formed within a first cell 101 and a second cell 103 of a sample. For example, the first portion of the third set of pattern elements 106 may be formed within the first cell 101, and the second portion of the third set of pattern elements 106 may be formed within the second cell 103. The third set of pattern elements 106 may be fabricated through one or more process steps such as, but not limited to, one or more deposition, lithographic, or etching steps. The third set of pattern elements 106 may be formed using one or more process tools (e.g., lithographic tools).

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology target comprising a first cell, wherein the first cell comprises:
    a first portion of a first set of pattern elements formed along a first measurement direction in a first sample layer, wherein the first set of pattern elements comprises segmented pattern elements having a first pitch;
    a first portion of a second set of pattern elements formed along the first measurement direction in a second sample layer, wherein the second set of pattern elements comprises segmented pattern elements having a second pitch; and
    a first portion of a third set of pattern elements formed along the first measurement direction in the first sample layer, wherein the third set of pattern elements comprises segmented pattern elements having a third pitch, wherein at least one of intensity or phase variations of diffraction orders of an illumination beam incident by the first portions of the first, second, and third sets of pattern elements as the sample is in motion correlate to overlay between the first and second sample layers along the first measurement direction.

2. The metrology target of claim 1, further comprising a second cell, wherein the second cell comprises:
    a second portion of the first set of pattern elements, wherein the second portion of the first set of pattern elements is formed along a second measurement direction in the first sample layer;
    a second portion of the second set of pattern elements, wherein the second portion of the second set of pattern elements is formed along the second measurement direction in the second sample layer; and
    a second portion of the third set of pattern elements, wherein the second portion of the third set of pattern elements is formed along the second measurement direction in the first sample layer, wherein at least one of intensity or phase variations of diffraction orders of an illumination beam incident on the second portions of the first, second, and third sets of pattern elements as the sample is in motion correlate to overlay between the first and second sample layers along the second measurement direction.

3. The metrology target of claim 2, wherein the metrology target is compatible with a scatterometry-based overlay (SCOL) metrology mode.

4. The metrology target of claim 3, wherein the metrology target is compatible with one or more on-the-fly metrology modes.

5. The metrology target of claim 2, wherein the at least one of intensity or phase variations of diffraction orders of an illumination beam incident by the second portions of the first, second, and third sets of pattern elements as the sample is in motion that correlate to overlay between the first and second sample layers along the second measurement direction comprise:
   at least one of +1 diffraction orders or −1 diffraction orders.

6. The metrology target of claim 1, wherein the sample comprises a semiconductor wafer.

7. The metrology target of claim 1, wherein the at least one of intensity or phase variations of diffraction orders of an illumination beam incident by the first portions of the first, second, and third sets of pattern elements as the sample is in motion that correlate to overlay between the first and second sample layers along the first measurement direction comprise:
   at least one of +1 diffraction orders or −1 diffraction orders.

8. A system comprising:
   one or more controllers having one or more processors communicatively coupled to one or more metrology sub-systems, wherein the one or more processors are configured to execute a set of program instructions maintained in memory, wherein the set of program instructions is configured to cause the one or more processors to:
      receive, from one or more detectors at one or more pupil planes of the one or more metrology sub-systems, one or more signals indicative of at least one of intensity or phase variations associated with diffraction orders of an illumination beam on one or more metrology targets on a sample, wherein the one or more metrology targets of the sample include a first cell, the first cell comprising:
         a first portion of a first set of pattern elements formed along a first measurement direction in a first sample layer, wherein the first set of pattern elements comprises segmented pattern elements having a first pitch;
         a first portion of a second set of pattern elements formed along the first measurement direction in a second sample layer, wherein the second set of pattern elements comprises segmented pattern elements having a second pitch; and
         a first portion of a third set of pattern elements formed along the first measurement direction in the first sample layer, wherein the third set of pattern elements comprises segmented pattern elements having a third pitch; and
      generate an overlay error measurement between the first and second sample layers along the first measurement direction based on the signals received from the one or more metrology sub-systems associated with at least one of intensity or phase variations of diffraction orders of the illumination beam by the first portions of the first, second, and third sets of pattern elements as the sample is in motion.

9. The system of claim 8, wherein the one or more metrology targets of the sample further comprise a second cell, wherein the second cell comprises:
   a second portion of the first set of pattern elements, wherein the second portion of the first set of pattern elements is formed along a second measurement direction in the first sample layer;
   a second portion of the second set of pattern elements, wherein the second portion of the second set of pattern elements is formed along the second measurement direction in the second sample layer; and
   a second portion of the third set of pattern elements in the first sample layer, wherein the second portion of the third set of pattern elements is formed along the second measurement direction, wherein the set of program instructions is further configured to cause the one or more processors to:
   generate an overlay error measurement between the first and second sample layers along the second measurement direction based on the signals received from the one or more metrology sub-systems associated with at least one of intensity or phase variations of diffraction orders of the illumination beam by the second portions of the first, second, and third sets of pattern elements as the sample is in motion.

10. The system of claim 9, wherein the at least one of intensity or phase variations of diffraction orders of an illumination beam incident by the second portions of the first, second, and third sets of pattern elements as the sample is in motion that correlate to overlay between the first and second sample layers along the second measurement direction comprise:
   at least one of +1 diffraction orders or −1 diffraction orders.

11. The system of claim 8, wherein the one or more metrology sub-systems comprise:
   an illumination source configured to generate the illumination beam;
   one or more illumination elements configured to direct the illumination beam from the illumination source onto the sample;
   one or more projection elements configured to collect illumination emanating from the sample and direct the illumination to the one or more detectors for generation of the signals.

12. The system of claim 11, wherein the one or more metrology sub-systems comprise one or more scatterometry-based overlay (SCOL) metrology sub-systems.

13. The system of claim 12, wherein the first overlay measurement, the second overlay measurement, and the third overlay measurement are acquired on-the-fly.

14. The system of claim 8, wherein the sample comprises a semiconductor wafer.

15. The system of claim 8, wherein the at least one of intensity or phase variations of diffraction orders of an illumination beam incident by the first portions of the first, second, and third sets of pattern elements as the sample is in motion that correlate to overlay between the first and second sample layers along the first measurement direction comprise:
   at least one of +1 diffraction orders or −1 diffraction orders.

16. A method of measuring overlay comprising:
illuminating a sample having one or more metrology targets;
detecting one or more signals indicative of at least one of intensity or phase variations associated with diffraction orders of an illumination beam on one or more metrology targets on a sample, wherein the one or more metrology targets of the sample include a first cell, the first cell comprising:
  a first portion of a first set of pattern elements formed along a first measurement direction in a first sample layer, wherein the set of pattern elements comprises segmented pattern elements having a first pitch;
  a first portion of a second set of pattern elements formed along the first measurement direction in a second sample layer, wherein the second set of pattern elements comprises segmented pattern elements having a second pitch; and
  a first portion of a third set of pattern elements formed along the first measurement direction in the first sample layer, wherein the third set of pattern elements comprises segmented pattern elements having a third pitch; and
generating an overlay error measurement between the first and second sample layers along the first measurement direction based on the signals received from the one or more metrology sub-systems associated with at least one of intensity or phase variations of diffraction orders of the illumination beam by the first portions of the first, second, and third sets of pattern elements as the sample is in motion.

17. The method of claim 16, wherein the one or more metrology targets of the sample further comprise a second cell, wherein the second cell comprises:
  a second portion of the first set of pattern elements, wherein the second portion of the first set of pattern elements is formed along a second measurement direction in the first sample layer;
  a second portion of the second set of pattern elements, wherein the second portion of the second set of pattern elements is formed along the second measurement direction in the second sample layer; and
  a second portion of the third set of pattern elements, wherein the second portion of the third set of pattern elements is formed along the second measurement direction in the third sample layer, wherein the method further comprises:
generating an overlay error measurement between the first and second sample layers along the second measurement direction based on the signals received from the one or more metrology sub-systems associated with at least one of intensity or phase variations of diffraction orders of the illumination beam by the second portions of the first, second, and third sets of pattern elements as the sample is in motion.

18. The method of claim 17, wherein the one or more metrology targets are compatible with a scatterometry-based overlay (SCOL) metrology mode.

19. The method of claim 18, wherein the first overlay measurement, the second overlay measurement, and the third overlay measurement are acquired on-the-fly.

20. The method of claim 17, wherein the at least one of intensity or phase variations of diffraction orders of an illumination beam incident by the second portions of the first, second, and third sets of pattern elements as the sample is in motion that correlate to overlay between the first and second sample layers along the second measurement direction comprise:
  at least one of +1 diffraction orders or −1 diffraction orders.

21. The method of claim 16, wherein the sample comprises a semiconductor wafer.

22. The method of claim 16, wherein the at least one of intensity or phase variations of diffraction orders of an illumination beam incident by the first portions of the first, second, and third sets of pattern elements as the sample is in motion that correlate to overlay between the first and second sample layers along the first measurement direction comprise:
  at least one of +1 diffraction orders or −1 diffraction orders.

23. A method of forming a metrology target comprising:
forming a first cell, the first cell comprising:
  a first portion of a first set of pattern elements formed along a first measurement direction in a first sample layer, wherein the first set of pattern elements comprises segmented pattern elements having a first pitch;
  a first portion of a second set of pattern elements formed along the first measurement direction in a second sample layer, wherein the second set of pattern elements comprises segmented pattern elements having a second pitch; and
  a first portion of a third set of pattern elements formed along the first measurement direction in the first sample layer, wherein the third set of pattern elements comprises segmented pattern elements having a third pitch, wherein at least one of intensity or phase variations of diffraction orders of an illumination beam incident by the first portions of the first, second, and third sets of pattern elements as the sample is in motion correlate to overlay between the first and second sample layers along the first measurement direction.

24. The method of claim 23, further comprising:
forming a second cell, the second cell comprising:
  a second portion of the first set of pattern elements, wherein the second portion of the first set of pattern elements is formed along a second measurement direction in the first sample layer;
  a second portion of the second set of pattern elements, wherein the second portion of the second set of pattern elements is formed along the second measurement direction in the second sample layer; and
  a second portion of the third set of pattern elements, wherein the second portion of the third set of pattern elements is formed along the second measurement direction in the first sample layer, wherein at least one of intensity or phase variations of diffraction orders of an illumination beam incident on the second portions of the first, second, and third sets of pattern elements as the sample is in motion correlate to overlay between the first and second sample layers along the second measurement direction.

* * * * *